United States Patent [19]

Arnold et al.

[11] 4,052,717
[45] Oct. 4, 1977

[54] BATTERY CONDITION MONITORING METHOD AND APPARATUS

[75] Inventors: John B. Arnold, Seville; John M. Bowyer, Copley; Howard R. Hegbar; Archie B. Shaefer, both of Akron, all of Ohio

[73] Assignee: Goodyear Aerospace Corporation, Akron, Ohio

[21] Appl. No.: 622,200

[22] Filed: Oct. 14, 1975

[51] Int. Cl.² .............................................. G08B 21/00
[52] U.S. Cl. ...................................... 340/249; 320/48
[58] Field of Search ............... 340/249, 253 C, 248 B; 324/29.5; 320/48; 307/10 BP

[56] References Cited

U.S. PATENT DOCUMENTS 3,621,359 11/1971 Schnegg ...................... 340/249 X Primary Examiner—John W. Caldwell
Assistant Examiner—Daniel Myer
Attorney, Agent, or Firm—J. G. Pere; P. E. Milliken

[57] ABSTRACT

A battery condition monitoring device which senses battery terminal voltage and creates a function thereof and tests that function against predetermined criteria and determines battery condition as a result of such tests. Furthermore, the invention operates on the transient of the battery terminal voltage existant immediately upon the loading of the battery. The test is performed on the slope of the terminal voltage transient and a function of that transient during a test period is created, analyzed and evaluated against reference levels.

16 Claims, 10 Drawing Figures

BATTERY CONDITION MONITORING METHOD AND APPARATUS

BACKGROUND OF THE INVENTION

Wet cell rechargeable batteries or secondary batteries such as lead-acid, silver-cadmium, nickel-cadmium, and silver-zinc deteriorate with age and usage because the plates shed active material and are chemically and mechanically altered during the charge-discharge cycles of normal operation. Such gradual deterioration ultimately results in a device that no longer can retain a useful charge of sufficient capacity to carry its normal load. The inconvenience of sudden and unanticipated battery failure is well known to operators of automobiles, aircraft, industrial traction trucks, and military vehicles. A battery-condition monitor that indicates the state of deterioration and which is capable of signalling the approaching end of useful life provides a useful expedient to the users of equipment dependent upon the proper operation of associated rechargeable batteries.

Heretofore, numerous approaches have been taken to provide a device capable of indicating the state of deterioration of such batteries. Approaches have been taken wherein a test for the conductivity of the electrodes of the battery is run since such conductivity changes with cycling and charge. Such an approach is set forth in U.S. Pat. No. 2,988,590. Yet other devices have been proposed such as in U.S. Pat No. 3,065,827 wherein voltage sensitive devices such as relays are provided to actuate charge indication means, such as lights, if the battery voltage is above or below a particular level. A similar approach, utilizing a warning light, is presented in the U.S. Pat. No. 3,118,137 wherein an electronic circuit is connected across the terminals of a battery to continually monitor the terminal voltage thereof and determine the state of the charge remaining in the battery as a function of the terminal voltage. This prior art structure requires a constant monitoring of the battery potential and consequent battery drain along one of two discharge paths.

Many other techniques and devices for the testing of battery conditions have been proposed wherein the specific gravity and/or chemical composition of the battery electrolyte is tested. Such tests are generally complex, inaccurate, and conducive only to a manual rather than automatic mode of operation. Other techniques of electronic analysis of battery condition are proposed in U.S. Pat. Nos. 3484681; 3500167; 3503062; 3529230; 3550105; and 3832629. While these references are of interest for purposes of general prior art concepts, the shortcomings thereof will be readily apparent in view of the embodiments of the instant invention presented herein.

It is an object of the instant invention to present a battery condition monitor for attachment to a vehicle battery and operative to test the condition of such battery at the instant of loading the same. This test is truly a measure of battery capability to service the existing load, at the instant of loading.

Still another object of the invention is to present a battery condition monitor wherein the transient voltage of the battery, under initial load, is tested and the general condition of the battery is determined thereby.

Yet another object of the invention is to verify subsystem integrity by testing loading situations that may be temporarily serviced by the battery but are detrimental to its service life.

Yet another object of the invention is to present a battery condition monitor wherein a basic testing technique on a lead cell battery is adaptable for any of numerous implementations.

Still a further object of the invention is to provide a battery condition monitor which is inexpensive to construct, reliable in operation, highly accurate in testing, has a low power standby posture, and is conducive to implementation in any of a multitude of systems incorporating rechargeable batteries.

These objects and other objects which will become apparent as the detailed description proceeds are achieved by: A battery condition monitoring device for connection across the terminals of a rechargeable battery, comprising: a function generator connected to the battery and producing an output signal as a function of the terminal voltage of the battery; a timing circuit connected between the battery and function generator for determining the time period for the output signal to reach a particular level; comparison means connected to said timing circuit for comparing the time period with preselected time references, the comparisons determining the condition of said battery; and display means connected to said comparison means for indicating the condition of said battery.

DESCRIPTION OF THE DRAWINGS

For a complete understanding of the objects, structure and techniques of the invention, reference should be had to the following detailed description and accompanying drawings wherein.

DETAILED DESCRIPTION OF PREFERRED EMBODIMENTS

A sensitive parameter of battery cell condition is the internal electrical resistance thereof. As a rechargeable battery ages and the plates shed active material, the internal resistance of the device increases the original value when the battery was new and first placed in service. Measurement of terminal voltage regulation; that is the drop in terminal voltage under load, can yield an evaluation of internal resistance when ambient temperature and the characteristics of the load are properly accounted for. Measuring and evaluating the behavior of internal cell resistance as a function of battery life can yield an assessment of battery condition, aging, and the associated probable remaining life. In automobile and similar applications, and for large variations in ambient temperature and under conditions where a heavy load is applied, it is convenient and appropriate to determine internal battery resistance in the time interval between starter switch contact closing and the instant of starter motor rotation.

In the automobile application, use of the initial current transient period following closing of the starter solenoid switch as a test cycle time provides several beneficial features. The monitoring device is only activated when the starter is operated, thus permitting avoidance of any substantial continuing battery drain by the monitoring device. Further, this initial starter current transient is a substantial load of several hundred amperes and the battery is tested near its maximum output. By proper choice of the turn-on and the end-of-test battery terminal voltage levels for circuit triggering, the test cycle can be restricted to the starter transient current period, thus avoiding activation of the monitor circuit by the normal loads of other auto electrical equipment.

Figure 1:
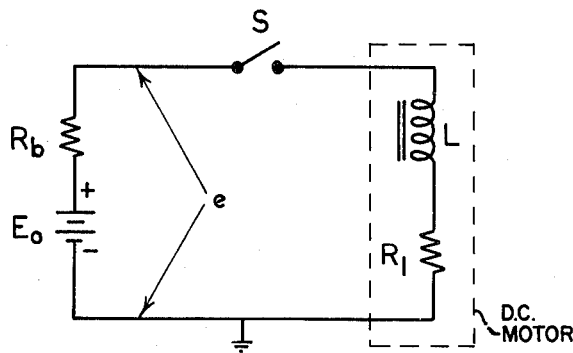
FIG. 1 is a schematic diagram of a battery-monitor circuit.

In automotive starting service, traction vehicles such as industrial fork-lift trucks and the like, a common circuit configuration exists which lends itself to the measurement of battery internal resistance under turn-on transient conditions. The configuration consists of a motor load suddenly switched across a battery. For convenience of analysis and discussion, individual cells will be treated as a series connected group comprising a single battery. A simplified and substantially equivalent circuit prior to motor turn off consists of the series connection of a battery of voltage Eo and its internal resistance Rb separated by means of an open switch S (which could represent the starter solenoid switch) from the respective inductance and resistance of the starter motor load L and Rl. Such a circuit is shown in FIG. 1. Solving for the instanaenous value of current in terms of the EMF and impedences which exist prior to the time at which the motor rotor just commences to rotate, some insight into the transient behavior of the circuit of FIG. 1 can be had.

Summing for the EMF's about the circuit by use of Kirchoff's Voltage Law:

$$Eo - iRb = iRl + Ldi/dt$$

$$Eo = i(Rb + Rl) + Ldi/dt$$

$$i = [Eo/(Rb + Rl)] [1 - \exp(-R b - Rl)t/L]$$

where (exp) = Napierian Logarithm base.

In reference to FIG. 1 it should be apparent that $e = Eo - iRb$. Since $Eo$ is constant as may be assumed for an idealized battery, $e$ varies as a function of current $i$ because of $Rb$, the apparent internal battery resistance. The regulation under load or drop in terminal voltage is thus:

$$Eo - e = iRb = eb$$

Figure 2:
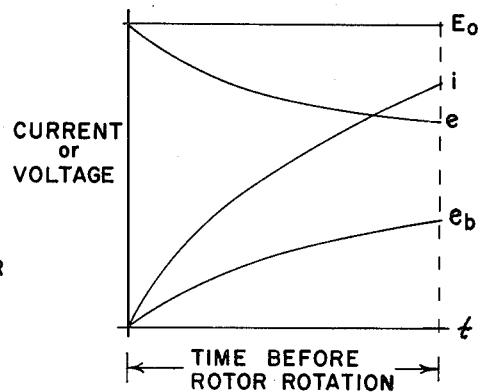
FIG. 2 is a response curve of the circuit parameters of FIG. 1 at the moment the battery is loaded.

The behavior of $i$, $e$ and $eb$ as a function of time is shown in FIG. 2, although it should be noted that the equations presented hereinabove and the graph of FIG. 2 is only valid for the locked-rotor case; that short time interval prior to rotor movement. When the rotor starts to turn, a back EMF is generated and, in the automobile case, the generator EMF starts to appear on the bus and thus the equations become invalidated by the introduction of these EMF's in addition to $Eo$.

It should be apparent that a change only in $Rb$ will cause a change in the current $i$, the terminal voltage $e$, and the internal battery drop $eb$. Measurement of these changes as influenced by $Rb$ and the assessment of the measured values forms a basis for the methods and structures of the inventions presented herein. The apparent internal electrical resistance $Rb$ of a battery has the smallest value when the battery is new, fully charged, and properly filled with electrolyte. The value of $Rb$ will increase due to aging of the battery, lack of charge in one or more cells, and a low level of electrolyte below the top of the cell plates. It should be noted that when the terminal voltage $e$, for the methods to be presented, is measured in the vehicle's circuit and not directly at the battery posts, the cable and cable terminal clamp resistance must be added to $Rb$. Corroded or high resistance cable terminal clamps can add enough resistance so as to increase the measured $Rb$ to a value that will yield a battery condition assessment below that which actually exists.

The methods and associated structures presented and described herein are intended to operate during the load current transient interval immediately following Turn-On. Although these methods treat the cells of the battery as a serially connected 2-terminal group, it should be understood that the principals, methods, and structures are applicable to individual cells taken singly or in any combination.

Further, since direct measurement of the battery current is difficult to achieve since the same involves inserting a current sensitive device or fixed resistor into the circuit, it has been found to be expedient to make voltage measurements at the cell or battery terminals. Therefore, the methods presented hereinbelow utilize the battery terminal voltage as the input to the monitoring device and its circuits. In methods described for measurement and assessment of $Rb$ and the associated battery condition, the circuits are triggered and activated when the terminal voltage $e$ drops to a preset initial threshold level V1. The time at which this occurs is defined as $t1$. This can be noted from reference to FIG. 3 and will be further discussed hereinafter.

There are presented several methods and structures for achieving the objects of the invention wherein a time interval $(t2 - t1)$ is measured for the assessment of $Rb$ and the associated battery condition. In each of the methods, a function $F(e)$ of the battery terminal voltage is created by the circuits. $F(e)$ varies in the time following $t1$ and when $F(e) = C$ (a preset constant value)$t2$ is measured. The time interval $(t2 - t1)$ is then compared to preset reference values to yield the accessment of $Rb$ and the corresponding battery condition. It will be noted that $F(e)$ is unique for each of the various methods and structures as are the preset constant values.

EMBODIMENT I

In this embodiment, $F(e) = e$ and $F(e)$ at time $t2 = C1$. In other words, C1 equals the preset voltage value which determines $t2$. The period of interest, P equals $(T2 - t1)$. It should therefore be apparent that P is of a larger magnitude for a good battery than a bad battery because a good battery takes longer to discharge.

Preset comparison values J1 and K1 have the dimension of time and are selected such that J1 is greater than K1. For a battery in good condition, P is greater than J1; for a battery in poor condition, P is less than K1; and for a battery in fair condition, P falls therebetween.

Figure 7:
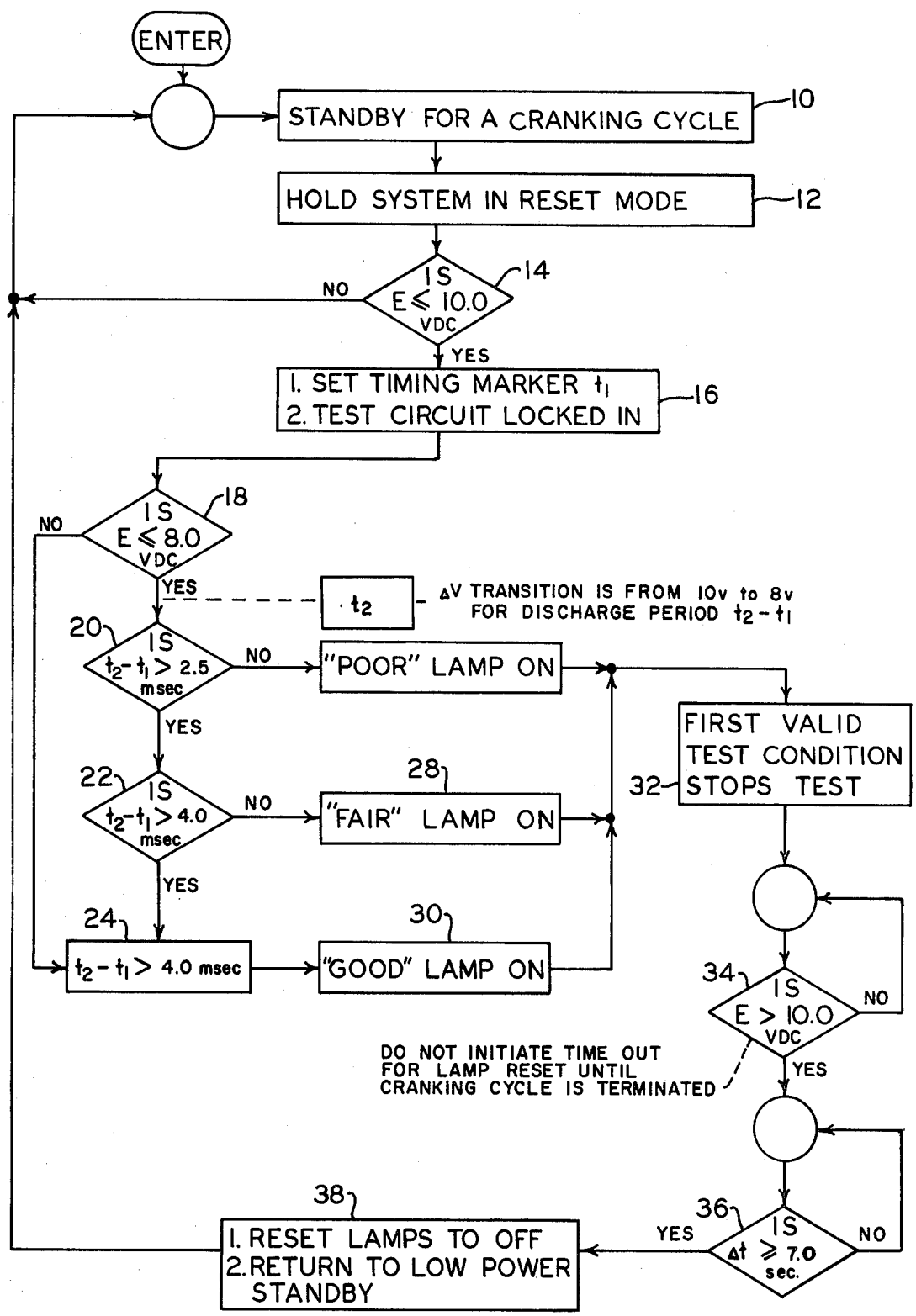
FIG. 7 is a flow chart of the operation of the embodiment of FIG. 3 in an analog mode.

Referring to FIG. 7, an analog flow chart of the operation of the structure for achieving the technique just described may be seen. The loop 10–14 is exercized to that point when the terminal voltage of the battery (and in this case a 12 volt battery) drops to V1(10 volts). At this time, the test mode is entered into with the setting of the timer to designate $t1$ at 16. Decision blocks 18–22 then determine the time interval for the battery terminal voltage to drop to a second fixed voltage level V2 (8 volts). Depending upon the time required for such a drop, a determination is made as to the condition of the battery and an indication made at 26–30. The test is stopped at 32 upon the first valid test condition being met. The battery condition indicator remains actuated during the cranking cycle or in other words until the battery terminal voltage again exceeds 10 volts as at decision block 34. If the voltage has returned to the V1 level and if the time elapsed is for example, at least 7 seconds as determined at decision block 36, the test cycle returns to stand by and the indicating lamps or other means are turned off. In other words, the lamp remains on during the entire cranking cycle and for seven seconds, after cranking is completed or abandoned.

Figure 9:
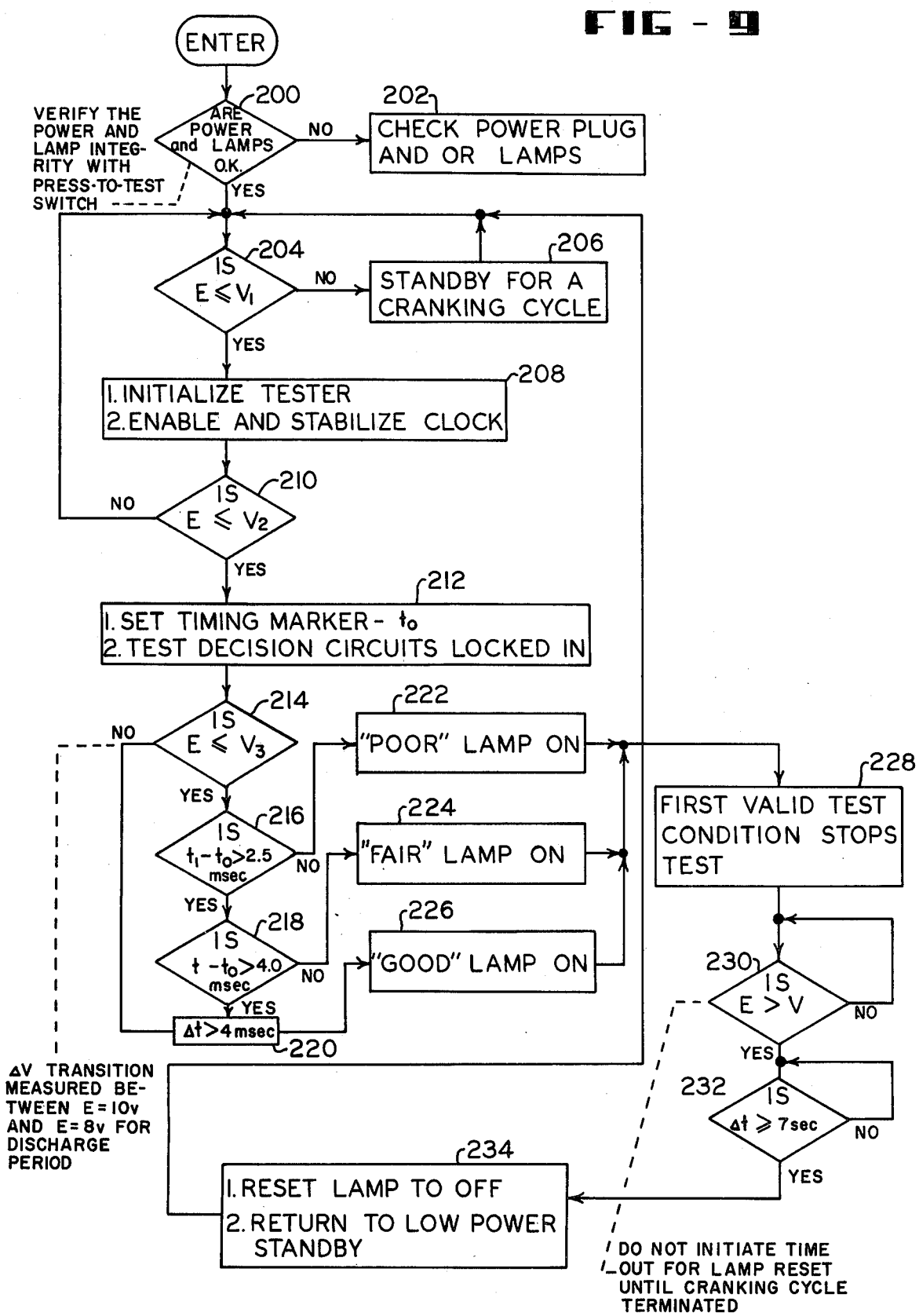
FIG. 9 is a flow chart of the operation of the embodiment of FIG. 3 in a digital mode.

Referring now to FIG. 9, a flow chart diagram of the operation of the circuitry necessary to achieve the technique just described in a digital mode may be seen. Note this flow chart corresponds with the circuitry presented in FIG. 10 and which will be presented in detail hereinafter.

Figure 10:
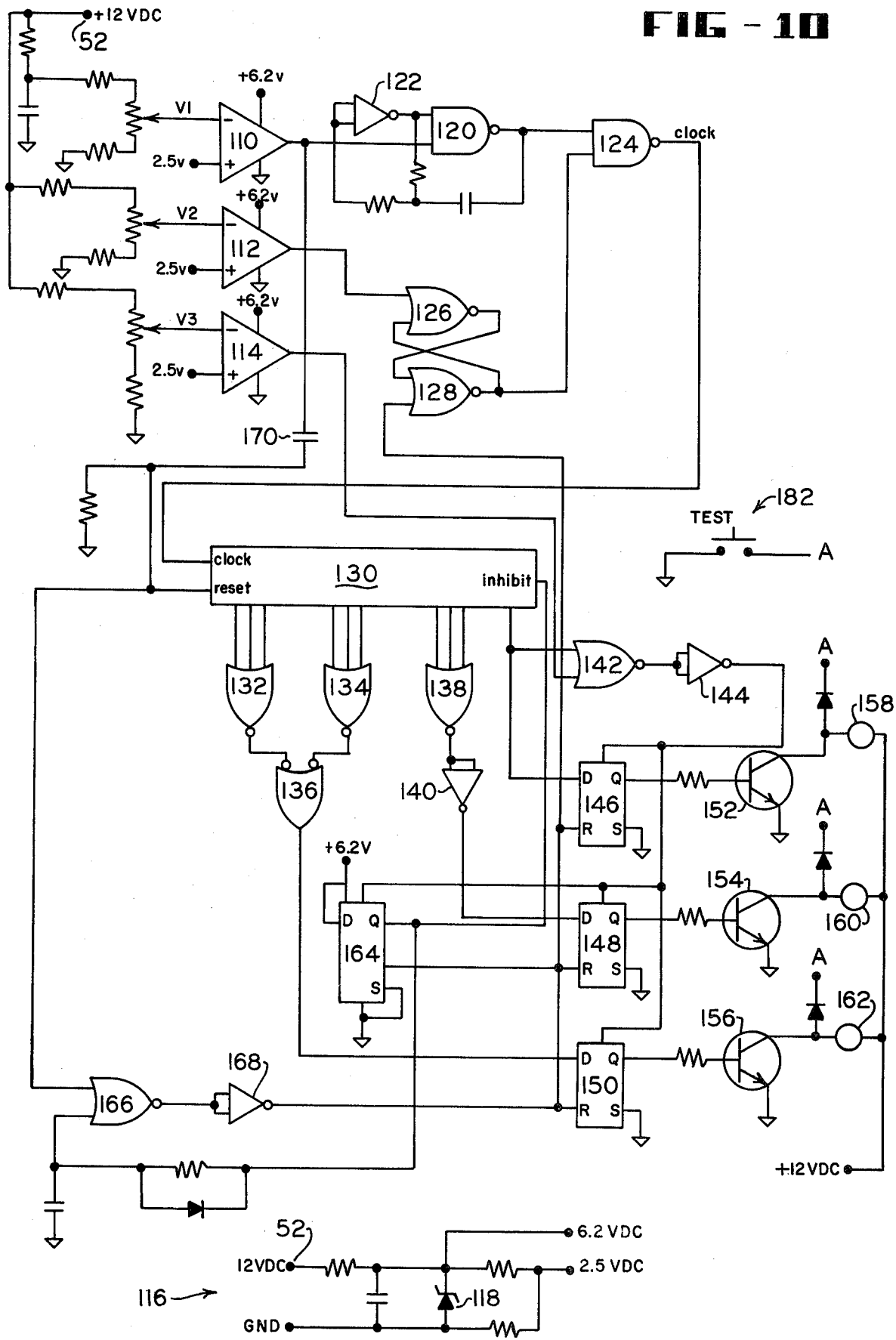
FIG. 10 is a schematic of the digital circuitry of the embodiment presented by the block diagram of FIG. 3 and the flow chart of FIG. 9.

As can be seen, a test of the operability of the indicating lamps is exercised at 200 by means of actuation of the test button 182 of FIG. 10. If a problem exists with such lamps, appropriate trouble shooting is exercised at 202. With the power and lamps being tested and in proper condition, a test is made at 204 as to whether the battery voltage is below V1. If the battery voltage is not below this level, the system stays in the standby mode at 206. Once the battery voltage has dropped to the V1 level, indicating that a cranking cycle has been entered into, the tester is initialized and the system clock enabled and stabilized. The system then waits at 210 until the terminal voltage drops to V2 at which time the testing period is established at 212. With the testing period running, the terminal voltage is monitored until such time as it drops to the V3 level at 214. If the terminal voltage reaches this level, then determinations are made at 216–220 as to the length of the time required for the transition from the V2 to V3 levels. Appropriate lamps are then illuminated as at 222–226. It should, of course, be noted that if the terminal voltage never reaches the V3 level at 214, then logic block 220 automatically rates the battery as being "good" at 226. The first valid test terminates the testing cycle at 228 and the lamps remain illuminated until such time as the battery terminal voltage has exceeded V1 and the illumination time has exceeded 7 seconds or some other appropriate time interval. These steps are indicated at 230 and 232. With the test being satisfied, the lamps are reset (turned off) and the system returns to the standby operation.

Figure 3:
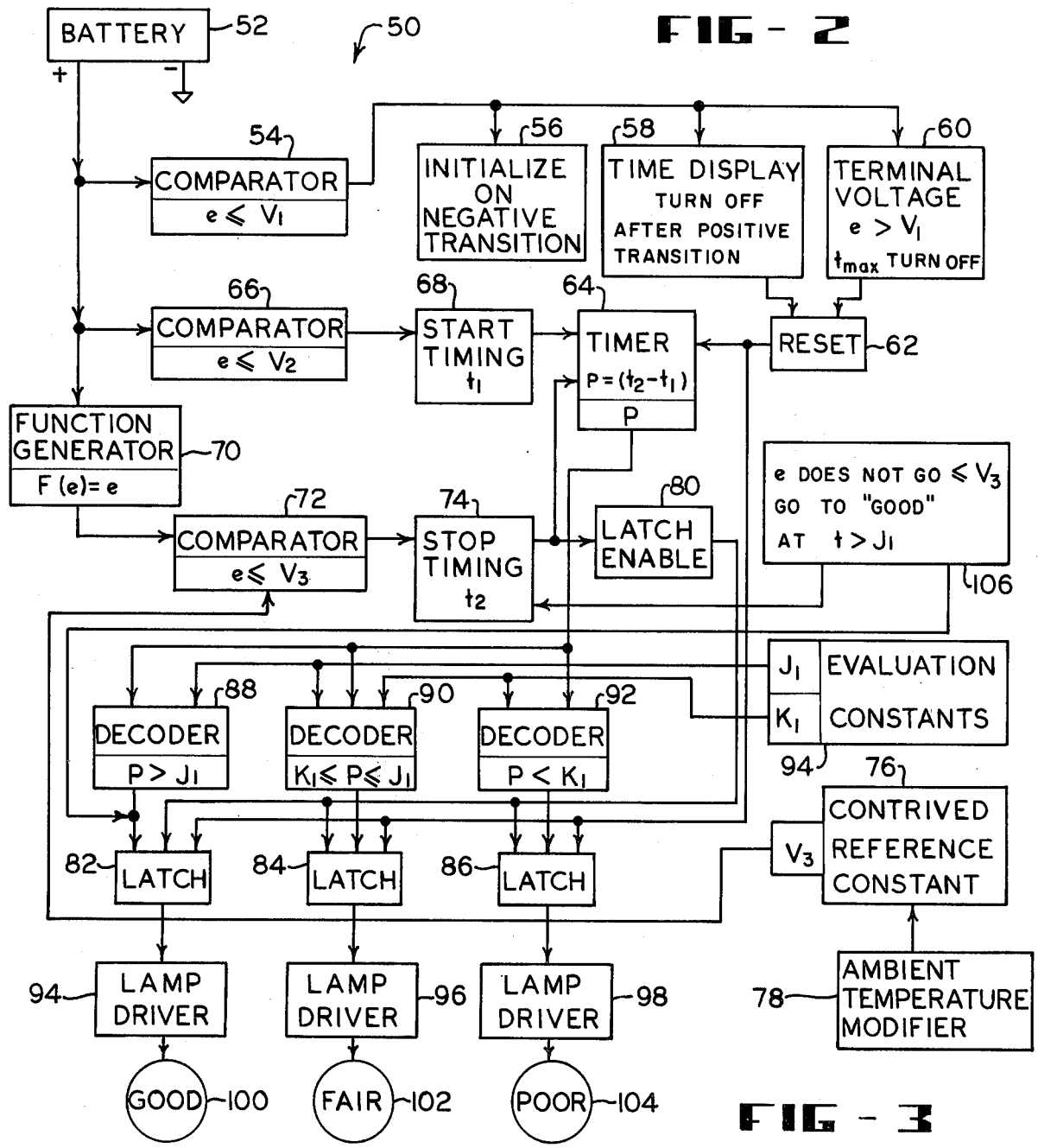
FIG. 3 is a block diagram of the circuitry comprising a first embodiment of the invention.

The flow chart of FIGS. 7 and 9 are reduced to a block diagram schematic in FIG. 3 and is designated generally by the numeral 50. The battery 52 is connected to the comparator 54 which is operative to sense the terminal voltage and to produce an output when that terminal voltage is less than or equal to a preselected voltage level V1. An output from the comparator 54 initializes the remaining circuitry on the negative transition of the transient voltage and, on the positive transition thereof, is operative to turn off the time display via the reset 62 of the timer 64. Further, if the terminal voltage is greater than V1 and a maximum amount of display time has run as at 60, then the reset function 62 is performed on the timer 64.

A comparator 66 is also connected to battery 52 and produces an output when the terminal voltage drops below a second reference V2 at which time the timer is started at 68, thus designating the time $t1$ or the beginning of the testing cycle.

The function generator of the embodiment under consideration is designated by the numeral 70. Since the function of the terminal voltage under consideration herein is the terminal voltage itself, the function generator 70 may comprise merely a noise decoupling circuit or could indeed be a wire passing the terminal voltage into the comparator 72. When the terminal voltage at the output of the function generator 70 is equal to or less than a preselected level V3, the timing is stopped at 74; thus determing the time $t2$. It should be noted that the reference voltage V3 is supplied by the reference voltage generator 76, as a constant; this constant being temperature compensated by appropriate temperature modification means 78 which are well known and understood by those skilled in the art. The start timing signal from 74 enables the latches 82–86 via the latch enable circuit 80 and terminates the operation of the timer 64, thus establishing the period P. This time period is compared against evaluation constants J1 and K1 establishing upper and lower time period limits; these constants being supplied via the source 94. Comparison is made in the decoders 88–92 as indicated and, dependent upon the length of the period P, the output of one of the decoders 88–92 is operative to respectively set one of the latches 82–86; these latches being respectively operative to actuate a lamp driver 94–98 for illuminating the associated lamp 100–104 representative of battery condition ratings of good to poor. Provisions are made stopping the timing if the terminal voltage has not dropped below the reference level V3. It should be noted at 106, that if the voltage does not drop to such a level then latch 82 is actuated when the time elapsed is greater than J1, the higher of the two evaluation constants from 94.

It should further be noted that the reset circuit 62 is operative to reset the plurality of latches 82–86 after the displays are turned off or after the maximum amount of time j1 has elapsed.

ANALOG EMBODIMENT OF STRUCTURE OF FIG. 3

Figure 8:
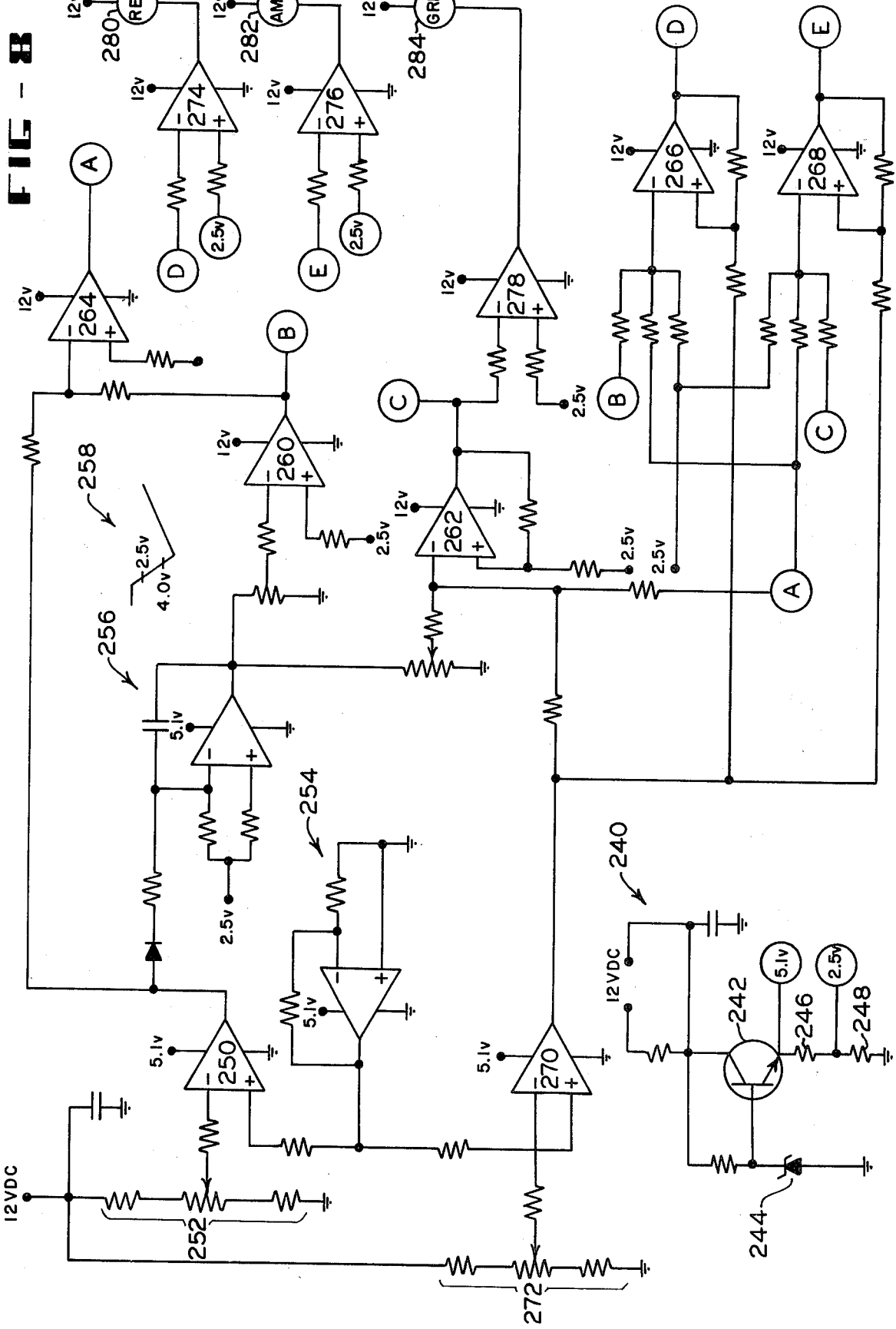
FIG. 8 is an analog embodiment of the circuitry of the block diagram of FIG. 3 and the flow chart of FIG. 7.

Referring now to FIG. 8, an analog embodiment of the structure of FIG. 3 may be seen. A voltage generator 240 is connected to the battery terminal voltage, and by virtue of the interconnection therewith of the transistor 242, zener diode 244 and the resistive voltage divider 246,248, the voltages necessary for the stable operation of the remainder of the circuitry shown in FIG. 8 are provided.

Referring to the circuitry hereof in light of the flow diagram of FIG. 7, it can be seen that the operational amplifier 250 is connected to the battery terminal voltage through the voltage divider network 252 to present an output pulse at time $t1$ beginning the testing cycle when the battery voltage drops to V1 (a 10 volt level).

Temperature compensation means are provided at 254 to render the operation of the battery condition monitoring circuit impervious to effects of temperature changes. The output of the operational amplifier 250, which has risen to a high level at time $t1$, is applied to the dual slope integrator 256 to create and maintain a calibrated and consistant time interval. The output of the dual slope integrator 256 is shown at 258. This signal is applied to operational amplifiers 260 and 262 to provide output pulses beginning respectively at 2.5 and 4 milli-seconds after the time 51 and each terminating at 7 seconds from such time. The operational amplifier 264 receives at a summing point the outputs of amplifiers 250 and 260 shown to present an enable signal output during the entire time from the drop of the battery terminal voltage to 10 volts until the timing out of the test period (7 seconds later).

The outputs of amplifiers 260 and 262 are respectively applied to summing points at the inputs of amplifiers 266 and 268. Also applied to the summing points of these amplifiers is the enable signal from the amplifier 264, combined with the output of amplifier 270 which, by virtue of the resistive voltage divider 272, is operative to present an output when the battery terminal voltage drops to 8 volts. With this signal being added to the summing points of the amplifiers 266, 268, it can be seen that appropriate outputs will be presented from these amplifiers dependent upon the time at which the battery voltage drops to the 8 volt level. If a voltage drops within the first 2.5 milli-seconds, then an output will be evident from amplifier 266 and if such a drop occurs in the first 4 milli-seconds, the signal will be evidenced at the output of amplifier 268. The outputs of the amplifiers 266 and 268 are respectively applied to amplifier drivers 274 and 276. A similar driver, 278 is connected directly to the output of the amplifier 262. Each of these drivers is in turn connected to an indication lamp 280–284 and, dependent upon the transient of the battery voltage, the appropriate driver illuminates the associated lamp. It should be clear that if the voltage never drops to the 8 volt level, then the output of the amplifier 262 will appropriately illuminate the light 284 via the driver 278 for the 7 second timing interval. The amplifiers 266, 268 are connected as latches to guarantee the proper length of illumination of the associated lights until the timing out of the display period as related by the switching of the amplifier 264 and the resetting of the system.

It should now be readily apparent that an analog embodiment of the structure of FIG. 3 may be readily developed.

DIGITAL EMBODIMENT OF STRUCTURE OF FIG. 3

Referring now to FIG. 10, the digitalization of the technique just described may be seen. Operational amplifiers 110–114 are interconnected to the battery terminal voltage at 52 by means of appropriate voltage dividers as shown. The positive inputs of the comparators 110–114 are connected to a fixed 2.5 volts supply generated by means of the circuit 116 which incorporates a 6.2 volt zener diode 118 and appropriate voltage divider resistors. The voltage divider is connected to the negative inputs of the operational amplifier 110–114 which are designed and adjusted such that the associated comparators produce outputs when the input voltages at the negative terminals relate the battery terminal voltage 52 as being at levels of V1, and V2, and V3 respectively.

At initial turn on, with the transient of the battery terminal voltage dropping to V1, the output of the amplifier 110 enables the gate 120. This gate is interconnected via a capacitive feed back network to the amplifier 122 and, by virtue of such feed back, is operative to present the clocked pulses necessary for achieving the timing required. The clocked pulses are passed through the gate 124 which is enabled by means of the latch 126, 128 when the battery terminal voltage drops below the second threshold level V2, thus initiating the test period.

The clocked pulses are passed to the counter 130 with the outputs thereon being decoded via logic gates 132–140. The decoded timing signals are supplied to the flip flops 146–150 which are clocked via the logic circuits 142, 144 when either the maximum time has been timed out via the counter 130 or the terminal voltage has reached the V3 level as determined by the output of 114. The flip flops 146–150 drive respective transistors 152–156 for gating on associated lamps 158–162. In any event, the flip flop 164 is clocked via gates 142,144 when the maximum time for display has been achieved. At this time, all the remaining flip flops are reset through gates 166, 168 and the entire system is initialized for the next turn-on cycle. Further, this resetting is accomplished via the output for 110 coupled through the capacitor 170 when the terminal voltage transient is rising and passes back across the V1 reference threshold.

EMBODIMENT II

Figure 4:
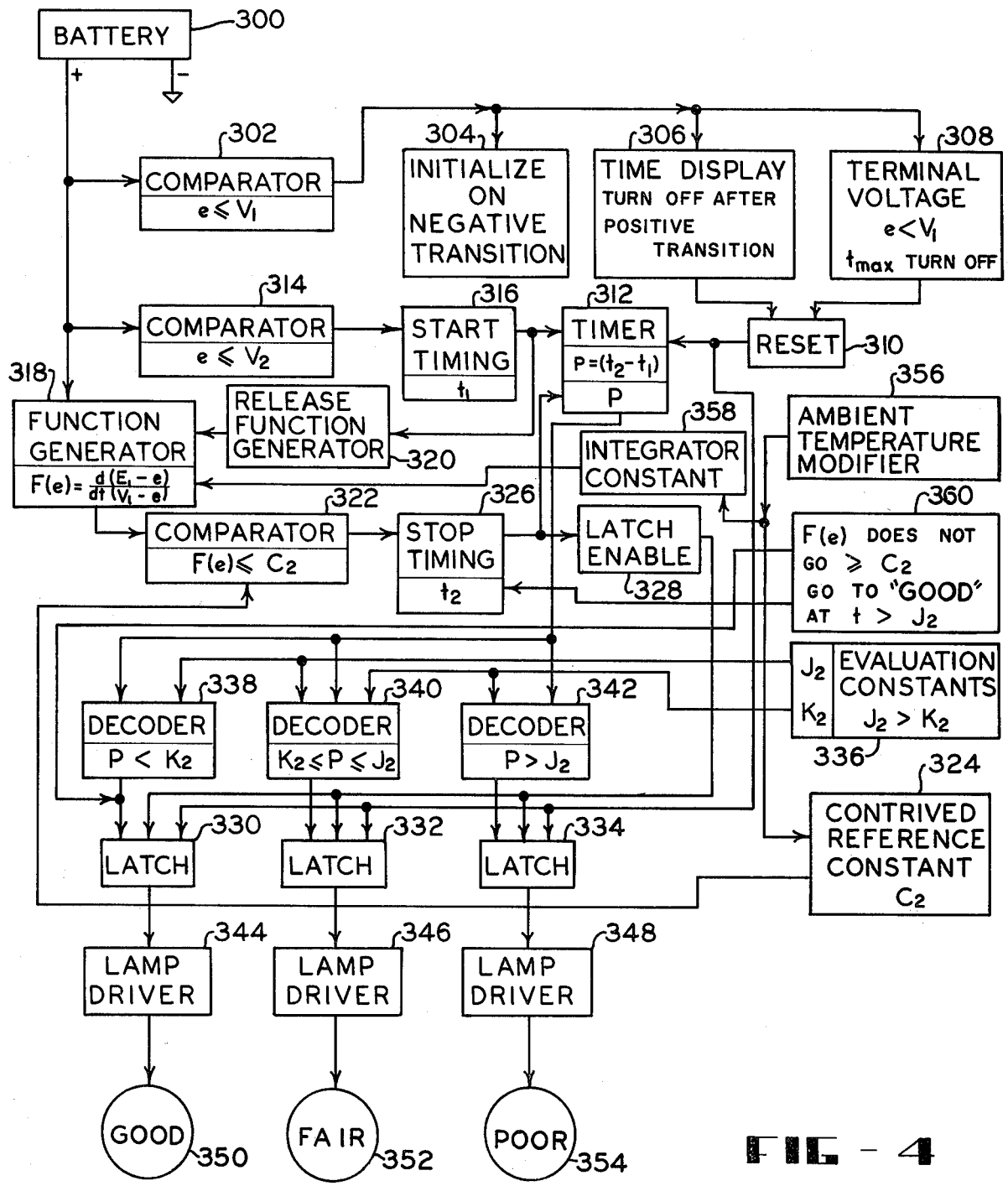
FIG. 4 is a block diagram of the circuitry comprising a second embodiment of the invention.

Referring now to FIG. 4, it can be seen that a different approach to the determination of battery condition may be achieved by virtue of a slight variation on the theme presented in FIG. 3. Specifically, the circuit elements from the battery 300 to the start timing circuit 316 are respectively identical to elements 52–68 presented in the embodiment of FIG. 3. The function generator 318, however, creates a single which is the differential with respect to time of the change in terminal voltage from the initial threshold voltage V1 which determines the beginning of the test period. As can be seen, the function generator 318 creates a signal indicative of the change with respect to time of the battery terminal voltage from the threshold voltage V1. The function generator is enabled by means of the circuit 320 at the time $t1$. The comparator 322 compares the function generated by the circuit 318 with the constant C2 provided from the circuit 324. At such time as the function is equal to or exceeds such constant, the timing of the timer 312 is stopped as at 326 and the period P established at 312 with the latch enable circuit 328 being activated to enable the latches 330–334. With the latches enabled and the period P having been established, a comparison is made as to the duration of the period P in comparison with the time constant J2 and K2 provided from the circuit 336. These comparisons are made via decoders 338–342. Of course, the lamp drivers and associated lamps 344–354 are conventional. It should be noted from the drawing of FIG. 4 that with J2 being greater than K2, a good battery will result in P being less than K2 and a poor battery will result in P being greater than J2 and a fair battery will result with P falling between the two limits.

It should be further noted that the circuitry of FIG. 4 is provided with an ambient temperature modifier 356 which provides an integrated constant 358 to the function generators 318 and further effects the constant C2 and 324. Yet further, if the function generated by 318 does not equal or exceed C2, then the battery is determined as being good when the test period is completed at J2. This structure is shown at 360.

Thus, it can be seen that a further embodiment of the invention teaches the differentiation of the variation of the battery terminal voltage with respect to a fixed reference level.

EMBODIMENT III

Figure 5:
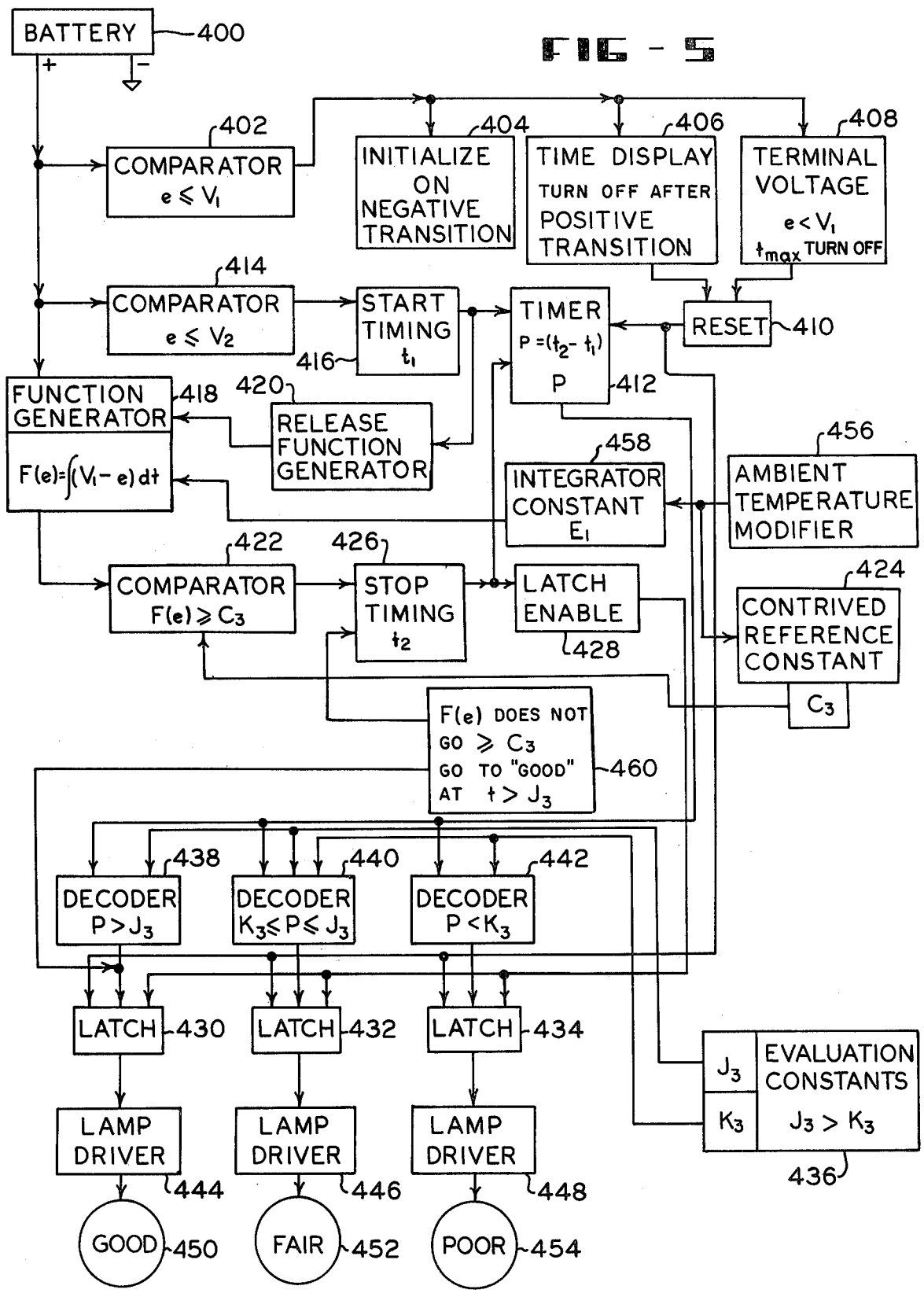
FIG. 5 is a block diagram of the circuitry comprising a third embodiment of the invention.

Referring now to FIG. 5, still a further variation on the theme of the invention may be seen. In this embodiment, the elements 400-420 perform substantially the same function as the elements 418 300-320 of the circuitry of FIG. 4, however, the function generator creates an integral of the variation of the battery terminal voltage from the fixed reference level V1. Again, the value of the integral is compared in 422 with a predetermined reference level supplied from 424. When the test criteria is met (the output of the function generator 418 equals the fixed reference level C3), the timing is stopped at 426, thus defining the test period P at 412. Similarly, the latch enable circuit 428 enables the latches 430-434 which are in turn operative to gate on the lamp drivers 444-448. Of course, the evaluation constant, J3 and K3, supplied by the circuit 436 are provided to the input of the decoder 438-442 for determination of the characteristics of the period P and consequently the battery condition. As can be seen with J3 being greater than K3, a good battery will be characterized by P being greater than J3, a poor battery will be characterized by P being less than K3 and a fair battery will be charcterized by P falling between the two limits.

Again, the drivers 444-448 are operative to illuminate the lamps or other indicating means 450-454.

Similar to the structure shown in FIG. 4, the embodiment of FIG. 5 incorporates an ambient temperature modifier 456 which determines an integrator constant 458 dependent upon the temperature under which the battery is being tested. Further, means are provided at 464 declaring the battery to be "good" if the integral function of 418 does not equal or exceed the reference level C3 and if the time $t$ is greater than J3.

EMBODIMENT IV

Figure 6:
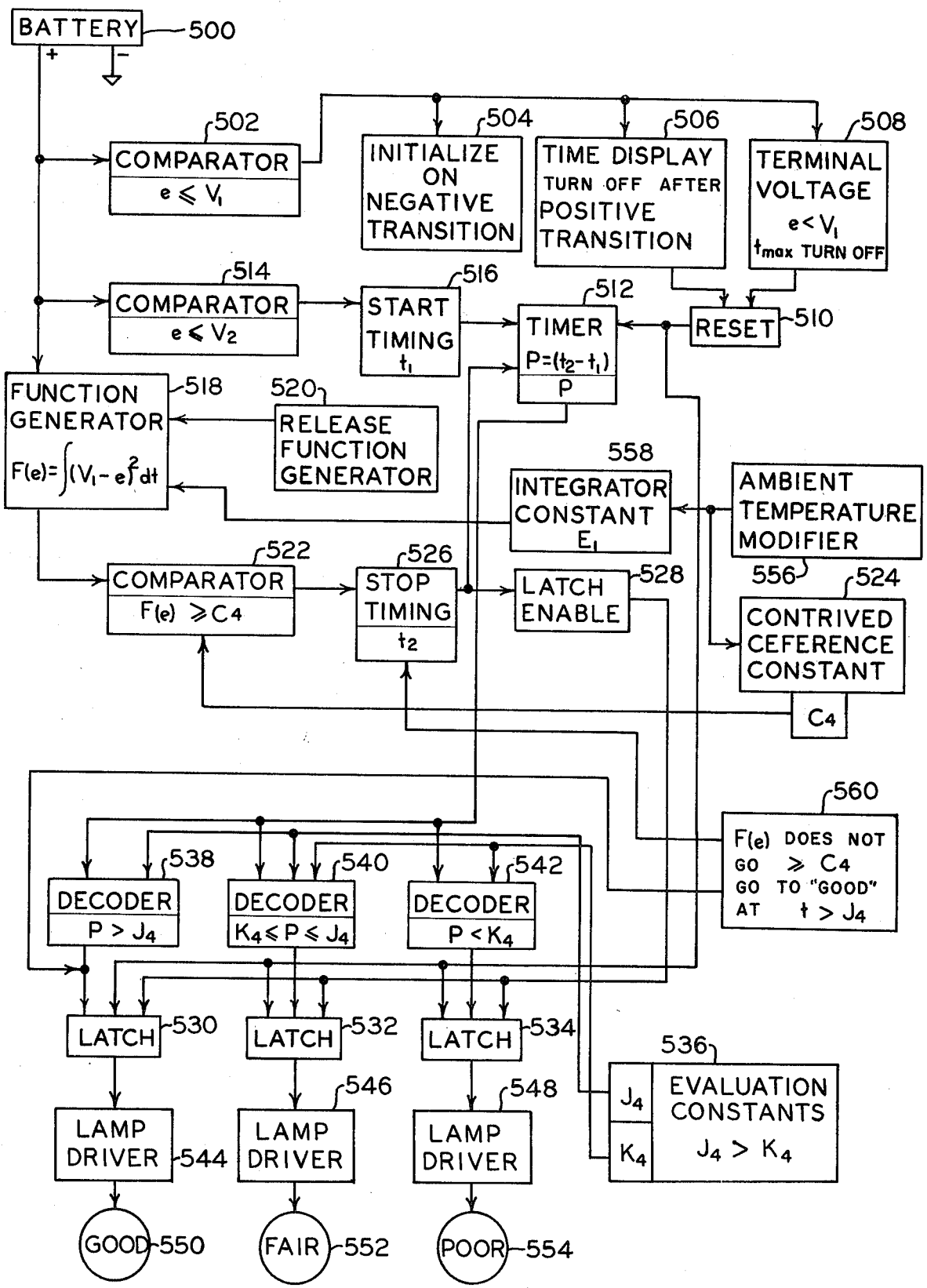
FIG. 6 is a block diagram of the circuitry comprising a fourth embodiment of the invention.

Referring now to FIG. 6, still a further embodiment on the basic theme of the invention may be seen. Again, the fundamental elements 500-520 are similar in structure and function to the corresponding elements of the earlier disclosed embodiments. However, the function generator 518 now produces a function which is an integral of the square of the difference or variation of the battery terminal voltage from a fixed predetermined level V1. Again, a comparator 522 receives a constant C4 from 524 to compare against the output of the function generator 518. Comparator 522 is operative to define the period P via the circuit 526 and to activate the latch enable circuit 528 which performs in the manner as discussed above to enable the latches 430-434. Evaluation constants J4 and K4 are supplied from the circuit 536 to the decoder 538-542 which compare the period P against the constants and are operative to actuate the associated latch, dependent upon test results, to activate the associated indication means 550-554. The relationship between period P length and battery condition is relatively apparent from the drawing of FIG. 6. Again, an ambient temperature modifier is provided at 556 to supply an integration constant via 558 to the integrator 518. Yet further, the circuit 560 provides for the classification of the battery as "good" if the function of terminal voltage generated at 518 does not equal or exceed the C4 level before the test time exceeds evaluation constant J4 as supplied from 536.

Thus, it can be seen that the objects of the invention have been satisfied by the structure and techniques presented hereinabove. Various embodiments and variations on the basic theme of the invention have been presented and described in detail. While in accordance with the Patent Statues, only the best mode and preferred embodiments of the invention have been presented and described in detail, the invention is not limited thereto or thereby. Consequently for an appreciation of the true scope and breadth of the invention, reference should be had to the following claims:

What is claimed is:

1. A battery condition monitoring device, comprising:
   an external load in selective engagement with the battery;
   first circuit means connected to the battery for creating an output voltage which is a function of battery terminal voltage;
   second circuit means connected to said first circuit means for receiving said output voltage and determining the time period necessary for the output voltage to change a predetermined amount after application of said external load to the battery; and
   third circuit means connected to said second circuit means for comparing said time period to preset reference values and grading the battery according to such time period.

2. The battery condition monitor as recited in claim 1 wherein said second circuit means includes a timing circuit for initiating said time period when the battery terminal voltage drops below a predetermined level after application of said external load.

3. The battery condition monitor as recited in claim 2 which further includes means for grading the battery as a top grade battery if battery terminal voltage does not drop below said predetermined level.

4. The battery condition monitor as recited in claim 1 which further includes means for compensating for ambient temperature variations from a norm.

5. The battery condition monitor as recited in claim 1 wherein said first circuit means produces said output voltage equivalent to said battery terminal voltage.

6. The battery condition monitor as recited in claim 1 wherein said first circuit means comprises a differentiating circuit producing said output voltage equivalent to the time derivative of said battery terminal voltage.

7. The battery condition monitor as recited in claim 1 wherein said first circuit means comprises an integrating circuit producing said output voltage equivalent to a time integral of said battery terminal voltage.

8. The battery condition monitor as recited in claim 1 wherein said third circuit means includes a plurality of grade indication means producing, for a fixed period of time, visual indicia of battery condition.

9. A method for determining the condition of a wet well rechargeable battery, comprising the steps of:
   a. applying an external load to the terminals of the battery;
   b. creating a voltage signal which is a function of the battery terminal voltage under such external load;
   c. timing the period necessary for said voltage signal to change a predetermined amount; and d. grading the battery as a function of the length of said time period.

10. The method as recited in claim 9 wherein step (c) is initiated when the battery terminal voltage drops below a first level.

11. The method as recited in claim 10 wherein step (c) is terminated when said voltage signal drops below a second level.

12. The method as recited in claim 9 wherein said voltage signal is created in step (b) by taking a time derivative function of the battery terminal voltage.

13. The method as recited in claim 9 wherein said voltage signal is created in step (b) by taking a time integral function of the battery terminal voltage.

14. Apparatus for monitoring the condition of a wet well rechargeable battery, comprising:
a function generator connected to said battery and producing an output voltage which is a particular function of the battery terminal voltage under external load;
a first voltage comparator circuit connected to said function generator and determining the time period required for the output voltage to change a predetermined amount; and
a grading circuit connected to said voltage comparator for producing an indicia of battery condition based on the length of said time period.

15. The apparatus according to claim 14 wherein said time period is initiated by a second voltage comparator when the battery terminal voltage drops below a first level, said second voltage comparator being connected to said battery.

16. The apparatus according to claim 15 wherein said time period is terminated by said first comparator when said output voltage reaches a second level.

* * * * *

UNITED STATES PATENT OFFICE
CERTIFICATE OF CORRECTION

Patent No. 4,052,717    Dated 10/04/77

Inventor(s) John B. Arnold, John M. Bowyer, Howard R. Hegbar, and Archie B. Shaefer It is certified that error appears in the above-identified patent and that said Letters Patent are hereby corrected as shown below:

Column 9, line 14, delete "418".

Signed and Sealed this

Twenty-first Day of February 1978

[SEAL]

Attest:

RUTH C. MASON  
Attesting Officer

LUTRELLE F. PARKER  
Acting Commissioner of Patents and Trademarks